United States Patent [19]

Vilkomerson

[11] 4,035,822

[45] * July 12, 1977

[54] PRESSURE SENSITIVE FIELD EFFECT DEVICE

[75] Inventor: David Herman Raphael Vilkomerson, Princeton, N.J.

[73] Assignee: RCA Corporation, New York, N.Y.

[ * ] Notice: The portion of the term of this patent subsequent to Aug. 31, 1993, has been disclaimed.

[21] Appl. No.: 558,470

[22] Filed: Mar. 14, 1975

[51] Int. Cl.² .................. H01L 29/78; H01L 29/84
[52] U.S. Cl. ........................ 357/26; 357/23
[58] Field of Search .................. 357/23, 26

[56] References Cited

U.S. PATENT DOCUMENTS

| | | | |
|---|---|---|---|
| 3,436,492 | 4/1969 | Reedyk | 357/26 |
| 3,585,415 | 6/1971 | Muller et al. | 357/26 |
| 3,978,508 | 8/1976 | Vilkomerson | 357/26 |

Primary Examiner—Edward J. Wojciechowicz
Attorney, Agent, or Firm—H. Christoffersen; R. P. Williams; R. A. Hays

[57] ABSTRACT

A pressure sensitive field effect semiconductor device which is one element of an integrated array is disclosed. The device employs a layer of elastomer material located substantially between the gate and the current carrying channel, to effectuate the conversion of a longitudinal pressure variation to an electrical variation. The device may inherently include amplification of the electrical variation. One use for the device is in an acoustic wave detector array.

3 Claims, 4 Drawing Figures

PRESSURE SENSITIVE FIELD EFFECT DEVICE

This invention generally relates to mechanical-electrical transducers and more particularly relates to semiconductor devices useful, for example, as acoustic wave detectors.

Conventional acoustic detectors employ piezo-electric ceramics, such as lead zirconate, to effectuate the conversion of acoustic waves to electrical signals. These materials are quite sensitive and fairly easy to obtain. However, in some applications involving large arrays of detectors, amplification and switching means are often required and must be provided as separate means which are connected to the detectors.

IN THE DRAWINGS

Figure 4:
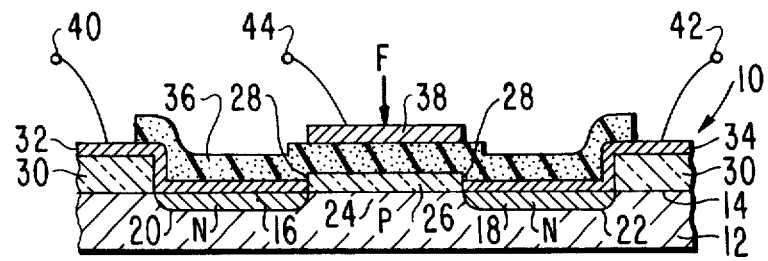
FIG. 4 is a partial cross-sectional view of the present device, not drawn to scale.

The present device which is a part of a semiconductor integrated circuit, indicated generally at 10 in the drawings, will best be understood structurally with reference to FIG. 4. The present device 10 comprises a body 12 of semiconductor material having one type conductivity, P type for example, and having a surface 14. Within the body 12 of semiconductor material and adjacent the surface 14 thereof, there is a first region 16 and a second region 18 both having a second type conductivity, N type in this example. A first PN junction 20 exists at the interface between the first region 16 and the body 12; and a second PN junction 22 exists at the interface between the second region 18 and the body 12. The first region 16 and the second region 18 in the body 12 of semiconductor material are spaced apart or separated therein by a channel region 24.

Preferably, a relatively thin insulating layer 26 overlies portions of the surface 14. The layer 26 has openings 28 which expose the first region 16 and the second region 18. A relatively thick insulating layer 30 overlies other portions of the surface 14.

A first electrode 32 overlies and electrically contacts the first region 16 through one of the openings 28. A second electrode 34 overlies and electrically contacts the second region 18 through another of the openings 28.

A nonconductive resilient compressible means 36 is disposed on the relatively thin insulating layer 26 over the channel region 24 in continuous contact therewith. Preferably the resilient compressible means 36 is an elastomer, such as silicone rubber. Almost any elastomer may be used for the resilient compressible means 36, such as polysulfide rubbers, butadiene-styrene copolymers, polychloroprene butadiene-acrylonitrile copolymers, isobutylene-diolefin copolymers, and the like. A layer 38 of conductive material overlies the resilient compressible means 36.

First, second, and third terminal means 40, 42, and 44 respectively, provide electrical contact to the first electrode 32, the second electrode 34, and the layer 38 of conductive material, respectively. The terminal means 40, 42, and 44 may be thin wires bonded or otherwise connected to the first electrode 32, the second electrode 34 or the layer 38 of conductive material, or they may be points of interconnection, by means of conductive paths, with other devices on the same body 12 of semiconductor material or other proximate devices.

Figure 1:
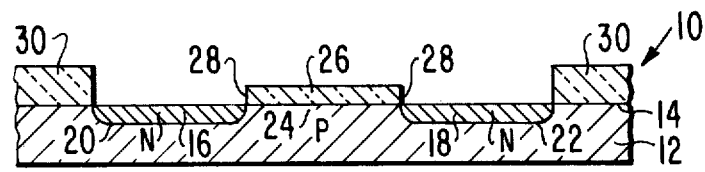
FIGS. 1 through 3 are partial cross-sectional views illustrating sequential steps in the fabrication of the present device, not drawn to scale.

The present device 10 may be fabricated in the following manner. Starting with the body 12 of semiconductor material, preferably silicon, the first region 16 and the second region 18 are introduced adjacent the surface 14. Any method known in the semiconductor art may be used, such as doped oxide diffusion, ion implantation, or the like. The relatively thick insulating layer 30 is then formed on the surface 14 by methods known in the art, for example thermal oxidation of the body 12. Using known photolithographic techniques, an opening, not labeled in the drawings, is then formed and the relatively thin insulating layer 26 is formed therein, by thermal oxidation for example. Using known etching and photolithographic techniques, the openings 28 are defined in the relatively thin insulating layer 26 and expose the first region 16 and the second region 18 therebelow, as shown in FIG. 1.

Figure 2:
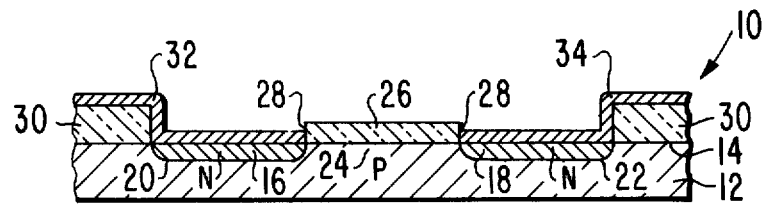

Using methods such as RF sputtering, chemical vapor deposition, or the like the first and second electrodes 32 and 34, respectively, are then formed. The material of the electrodes may be gold, aluminum, or any other conductive material compatible with the particular method used; for example, gold may be used in an RF sputtering method. Preferably the first and second electrodes 32 and 34, respectively, are formed so that they extend over portions of the relatively thick insulating layer 30. The resulting structure is diagramatically shown in FIG. 2.

Figure 3:
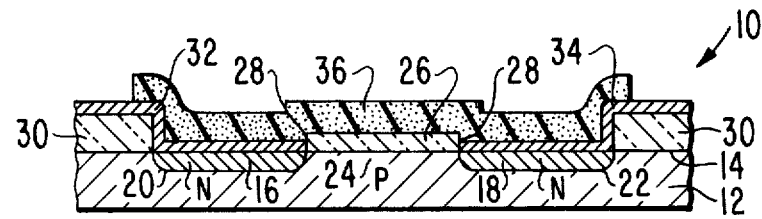

The nonconductive resilient compressible means 36 is disposed on the relatively thin insulating layer 26, in continuous contact therewith, over the channel region 24 by dip coating, for example. The resilient compressible means 36 may be, for example, an elastomer such as RTV 602 which is a silicone rubber made and marketed by General Electric Company. One way to make the means 36 is to add 1.5 grams of SRC 05, a catalyst marketed by the General Electric Company, to 19.5 grams of RTV 602 dissolved in 100 milliliters of cyclohexane. The device 10 is then dipped into the solution to coat it. Preferably, the thickness of the layer of elastomer 36 is between from about 0.5 $\mu$m to about 10 $\mu$m, for example, about 1 $\mu$m thick. In the dip coating procedure, the thickness of the layer of elastomer is inversely proprotional to the rate at which the device 10 is removed from the solution. For a layer of approximately 1 $\mu$m thickness, the device 10 is preferably removed at a rate of approximately 4 linear inches per minute from the above solution, which has a viscosity about that of castor oil. The device 10 is preferably removed at the above rate in a manner such that the direction of removal is substantially perpendicular to the surface 14 to be coated. The elastomer is then cured, for example, by heating it to about 60° C. for about one hour. The layer of elastomer is defined using masking and photolithographic techniques. For example, a layer of photoresist, not shown in the drawings, may be used as a mask, and cyclohexane may be used as a solvent. The device 10, coated and defined in this manner, is shown in FIG. 3.

The layer 38 of conductive material may be formed by any method known in the semiconductor art. Preferably, the device 10 is placed in a bell jar and a metal mask is then interposed in front of it. Conductive material is then evaporated in such a manner that it adheres to the layer 36 through an opening in the mask, not shown in the drawings. Preferably the material of layer 38 is gold but it may also be any conductive material having a similar ductility.

The first, second, and third terminal means, 40, 42, and 44, respectively, may be formed by employing any technique known in the semiconductor art.

The preferred operation of the present device 10 is similar to the conventional operation of an insulated gate field effect transistor (IGFET). In this mode of operation the first region 16 may act as the source region, the second region 18 may act as the drain region and the layer 38 of the conductive material may act as the gate. It will be understood that in a symmetrical device the first region 16 may act as the drain region, in which case the second region 18 would act as the source region. The device 10 may be operated in either the enhancement mode or the depletion mode. As those skilled in the art will recognize, when operated in the enhancement mode a current carrying channel will be formed in the channel region 24, when there exists a positive potential on the gate 38; when operated in the depletion mode the current carrying channel will exist in the channel region 24 when there exists a zero or a negative potential on the gate 38.

The voltage potential applied to the gate 38 by way of the third terminal means 44 creates an electric field which, in the enhancement mode, attracts charge carriers into the channel region 24 or, in the depletion mode, forces carriers from the channel region 24, thereby varying the conductivity of the current carrying channel by an amount dependent upon the strength of the electric field. The strength of the electric field is in turn dependent upon the voltage potential at the gate 38, the dielectric constant of the material through which it operates, and the thickness of the material through which it operates.

When pressure is applied to the resilient compressible means 36, for example, a pressure in the direction of the arrow F as shown in FIG. 4, the thickness of the resilient compressible means 36 changes. Hence, the strength of the electric field varies, and this results in the number of charge carriers in the current carrying channel changing accordingly. By properly biasing the source region 16 and the drain region 18, for example connecting the first terminal means 40 to a ground potential, applying about 10 volts to the second terminal means 42 and applying about 50 volts to the third terminal means 44, any variation in the strength of the electric field will appear amplified at the drain region 18. Therefore, the device 10 has an output signal available at the drain terminal means 42 which is an amplified response of the pressure applied to the resilient compressible means 36. Thus, as the pressure applied to the resilient compressible means 36 changes, the output signal changes accordingly. An example of such a pressure variation is a longitudinal pressure wave, or an acoustic wave, impinging on the gate 38 in the direction of the arrow F in FIG. 4.

Referring to the operation in the enhancement mode, if the voltage potential applied to the gate 38 is set near the threshold voltage; i.e., that voltage which creates a current carrying channel in the channel region 24, then the device 10 may be operated as a switch. That is, when pressure is applied, the increase in the strength of the electric field would be sufficient to create a current carrying channel and allow conduction from the source region 16 to the drain region 18. It will be appreciated by those in the semiconductor art that the device 10 may be operated as a switch in the depletion mode as well.

The present device 10, when operated in the described manner, may be used for acoustic wave detection. Using known technology the device 10 may also be integrated as one element of an acoustic wave detector array. By varying the voltage potential applied to the gate 38 or by varying the thickness of the resilient compressible means 36 or its composition, a relatively wide range of pressure sensitivities of the device 10 is attainable.

The present device 10 is compatible with, and may be fabricated using, other known semiconductor integrated circuit techniques such as, for example, silicon-on-sapphire. The choice of technique may depend upon the requirements of surrounding devices in the integrated circuit. For example if relatively high speed devices are to be incorporated with the present device 10 then silicon-on-sapphire, or like techniques, may be preferable.

What is claimed is:
1. A pressure sensitive field effect device which is a part of a semiconductor integrated circuit which comprises:
   a first region and a second region in a body of semiconductor material, adjacent to a surface of said body and separated therein by a channel region, said channel region having an insulating layer disposed thereover;
   nonconductive, resilient, compressible means disposed on said insulating layer in continuous contact therewith over at least said channel region, said means being a layer of an elastomer; and
   a gate electrode on said nonconductive, resilient, compressible means over said channel region.
2. A pressure sensitive field effect device as claimed in claim 1 wherein:
   said elastomer is a silicone rubber.
3. A pressure sensitive field effect device as claimed in claim 1 wherein:
   said resilient, compressible means is about one $\mu$m thick.

* * * * *